(12) United States Patent
Chen et al.

(10) Patent No.: US 10,340,180 B1
(45) Date of Patent: Jul. 2, 2019

(54) MERGE MANDREL FEATURES

(71) Applicant: GLOBALFOUNDRIES INC., Grand Cayman (KY)

(72) Inventors: Hsueh-Chung Chen, Cohoes, NY (US); Martin J. O'Toole, Saratoga Springs, NY (US); Terry A. Spooner, Mechanicville, NY (US); Jason E. Stephens, Menands, NY (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 0 days.

(21) Appl. No.: 15/872,314

(22) Filed: Jan. 16, 2018

(51) Int. Cl.
| | |
|---|---|
| *H01L 21/768* | (2006.01) |
| *H01L 23/522* | (2006.01) |
| *H01L 23/528* | (2006.01) |
| *H01L 21/033* | (2006.01) |
| *H01L 23/532* | (2006.01) |

(52) U.S. Cl.
CPC .... *H01L 21/76816* (2013.01); *H01L 21/0335* (2013.01); *H01L 21/0337* (2013.01); *H01L 21/76877* (2013.01); *H01L 23/5226* (2013.01); *H01L 23/5286* (2013.01); *H01L 23/53209* (2013.01); *H01L 23/53228* (2013.01); *H01L 23/53242* (2013.01); *H01L 23/53257* (2013.01); *H01L 23/53271* (2013.01)

(58) Field of Classification Search
CPC ............ H01L 23/5226; H01L 23/5329; H01L 2924/01029; H01L 2924/01013; H01L 23/5225; H01L 21/28518; H01L 21/76843; H01L 21/76801; H01L 21/3086; H01L 21/0274
USPC ........ 257/757, 758, 759; 438/118, 622, 623, 438/647
See application file for complete search history.

(56) References Cited

U.S. PATENT DOCUMENTS

| | | | |
|---|---|---|---|
| 8,782,586 B2 * | 7/2014 | Sezginer | G06F 17/5077 716/126 |
| 8,839,168 B2 | 9/2014 | Kye et al. | |
| 9,412,655 B1 | 8/2016 | Bouche et al. | |
| 2011/0014786 A1 * | 1/2011 | Sezginer | G06F 17/5077 438/618 |
| 2015/0143309 A1 * | 5/2015 | De Dood | G06F 17/5068 716/107 |
| 2015/0214064 A1 * | 7/2015 | Pritchard | H01L 21/3088 438/585 |
| 2017/0154886 A1 * | 6/2017 | Chang | H01L 29/66545 |
| 2018/0108527 A1 * | 4/2018 | Huang | H01L 21/0332 |

* cited by examiner

*Primary Examiner* — Thinh T Nguyen
(74) *Attorney, Agent, or Firm* — Anthony Canale; Andrew M. Calderon; Roberts Mlotkowski Safran Cole & Calderon, P.C.

(57) ABSTRACT

The present disclosure relates to semiconductor structures and, more particularly, to merged mandrel lines and methods of manufacture. The structure includes: at least one metal line having a first dimension in a self-aligned double patterning (SADP) line array; and at least one metal line having a second dimension inserted into the SADP line array, the second dimension being different than the first dimension.

13 Claims, 3 Drawing Sheets

MERGE MANDREL FEATURES

FIELD OF THE INVENTION

The present disclosure relates to semiconductor structures and, more particularly, to merged mandrel features and methods of manufacture.

BACKGROUND

In order to conduct more current, it is necessary to use wide metal lines for power rail applications. However, there are many hurdles to overcome in order to insert selective wide metal lines in a self-aligned double patterning (SADP) line array. This is due to all metal lines being printed and patterned in the same width and pitch in the SADP scheme. To overcome such obstacles, a complicated pattering scheme needs to be used which requires additional masks and fabrication processes. This results in significantly higher manufacturing complexity and costs.

More specifically, the width of metal lines is limited by the photolithography processes required by the SADP integration, used to pattern the trenches in the interlevel dielectric material. In SADP integration, for example, a mandrel is patterned by conventional lithography and etching processes. Spacers are formed on sidewalls of the patterned mandrel, with the patterned mandrel subsequently being removed through conventional etching processes. The removal of the mandrels results in the spacers being used as an etch mask for patterning of the underlying hard mask layer. The patterned hard mask layer is then used to etch trenches in the inter-metal dielectric material, which are filled with metal material to form the metal lines for power rail applications. But, due to the regular nature of the spacers, i.e., line width and spacing, it is not possible to form trenches with different widths, much less with widths greater than the width of the patterning process. The patterning of the wider lines, e.g., needed for high current capacity power rails, thus requires additional masking and patterning steps, resulting in increased fabrication complexity and cost.

SUMMARY

In an aspect of the disclosure, a structure comprises: at least one metal line having a first dimension in a self-aligned double patterning (SADP) line array; and at least one metal line having a second dimension inserted into the SADP line array, the second dimension being different than the first dimension.

In an aspect of the disclosure, a method comprises: forming a first mandrel pattern having a first dimension in a self-aligned double patterning (SADP) line array; and forming a second mandrel pattern having a second dimension inserted into the SADP line array, where the second dimension is different than the first dimension.

In an aspect of the disclosure, a method comprises: depositing and patterning a first hardmask over mandrel material, the patterned first hardmask corresponding with a dimension of a first mandrel pattern; depositing and patterning a second hardmask bridging over adjacent patterns of the patterned first hardmask covering the mandrel material, the second hardmask corresponding with a dimension of a merged mandrel pattern; removing exposed mandrel material while protecting the mandrel material that is covered by the first patterned hardmask and the second patterned hardmask; and removing the first patterned hardmask and the second patterned hardmask, leaving the first mandrel pattern with the first dimension and the merged mandrel pattern.

BRIEF DESCRIPTION OF THE DRAWINGS

The present disclosure is described in the detailed description which follows, in reference to the noted plurality of drawings by way of non-limiting examples of exemplary embodiments of the present disclosure.

DETAILED DESCRIPTION

The present disclosure relates to semiconductor structures and, more particularly, to merged mandrel features (e.g., pattern) and methods of manufacture. More specifically, the present disclosure is directed to a method to manufacture merged mandrel lines in a self-aligned double patterning (SADP) scheme and resultant structures (e.g., wide metal lines for power rail applications). Advantageously, by implementing the processes described herein, it is now possible to form wide power rails at any location and which have different widths throughout the chip area.

In embodiments, the processes described herein use a block lithography process, after a conventional mandrel patterning step, to merge mandrel lines. As a result, the merged mandrel lines can be used to fabricate wide power rails for conducting high electrical current. With this method, it is possible not only to define wide power rails (e.g., metal lines) at any location, but also to have the flexibility to define the width of the power rails in a SADP integration scheme. In embodiments, the wide metal lines for power rail applications can be used as low resistance interconnects.

The merged mandrel patterns (lines) and resultant power rails of the present disclosure can be manufactured in a number of ways using a number of different tools. In general, though, the methodologies and tools are used to form structures with dimensions in the micrometer and nanometer scale. The methodologies, i.e., technologies, employed to manufacture the merged mandrel patterns and resultant power rails of the present disclosure have been adopted from integrated circuit (IC) technology. For example, the structures are built on wafers and are realized in films of material patterned by photolithographic processes on the top of a wafer. In particular, the fabrication of the merged mandrel patterns and resultant power rails uses three basic building blocks: (i) deposition of thin films of material on a substrate, (ii) applying a patterned mask on top of the films by photolithographic imaging, and (iii) etching the films selectively to the mask.

Figure 1:
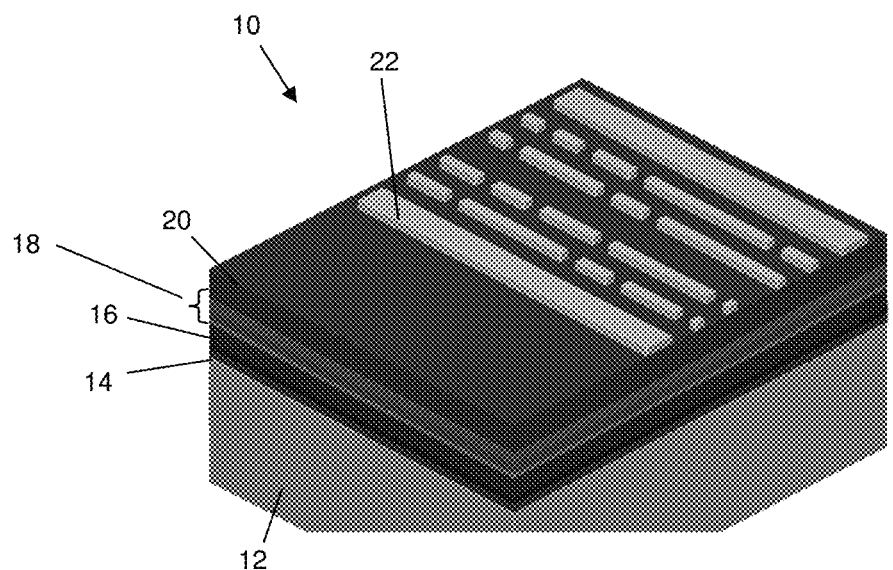
FIG. 1 shows a patterned hardmask, amongst other features, and respective fabrication processes in accordance with aspects of the present disclosure.

FIG. 1 shows a patterned hardmask, amongst other features, and respective fabrication processes in accordance with aspects of the present disclosure. More specifically, the structure 10 includes a substrate material 12 composed of any suitable semiconductor material. In embodiments, the substrate material 12 can be, e.g., Si, SiGe, SiGeC, SiC, GaAs, InAs, InP, and other III/V or II/VI compound semiconductors. A cap material 14 is deposited on the substrate material 12. The cap material 14 can be, e.g., nitride or SiOC. A dielectric material 16 is deposited on the cap material 14. In embodiments, the dielectric material 16 can be any low-k or ultra-low-k dielectric material, e.g., oxide material. As should be understood by those of skill in the art, the dielectric material 16 will be patterned (e.g., trenches formed in the dielectric material) to form metal wiring structures, e.g., metal lines for power rail applications, etc.

Still referring to FIG. 1, a hardmask stack 18 is formed on the dielectric material 16. In embodiments, the hardmask stack 18 can include several different layers of materials. For example, the hardmask stack 18 can include a sacrificial hardmask (e.g., SiN), a metal hardmask (e.g., TiN) and a capping material (e.g., SiN). A mandrel material, e.g., amorphous silicon, 20 is formed on the hardmask stack 18. A patterned hardmask 22 is formed on the mandrel material, e.g., to provide mandrel patterns or lines in subsequent etching processes. The patterned hardmask 22 can be formed by conventional lithography and etching processes, e.g., reactive ion etching (RIE).

Figure 2:
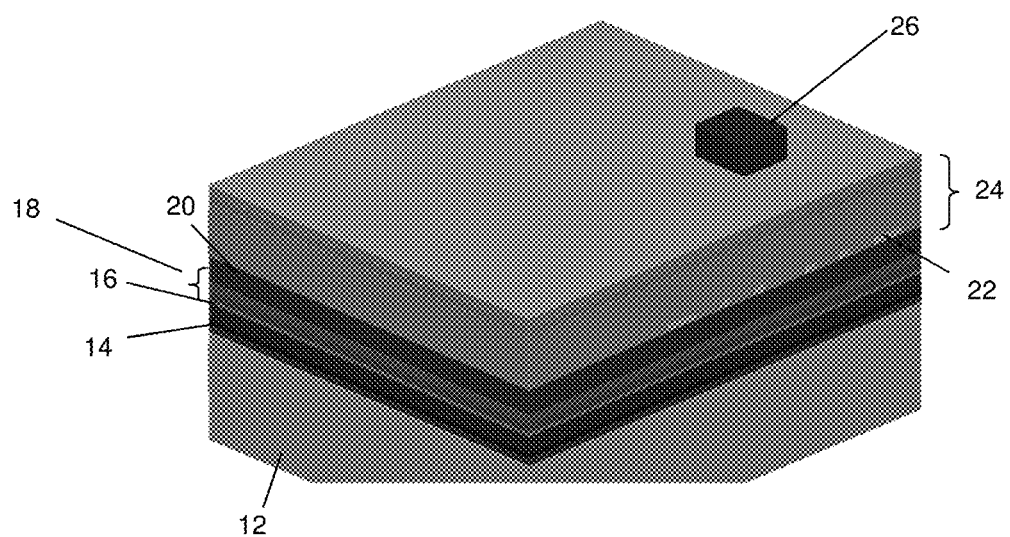
FIG. 2 shows a lithography stack and pattern of resist material, amongst other features, and respective fabrication processes in accordance with aspects of the present disclosure.

In FIG. 2, a lithography stack 24 is formed over the patterned hardmask 22 and exposed portions of the mandrel material 20. In embodiments, the lithography stack 24 can include an organic planarization layer (OPL) material, an oxide hardmask and a block material, e.g., barrier and etch stop film for damascene interconnect applications. A resist material 26 is formed and then patterned on the lithography stack 24. The patterned resist material 26 will be used to form a merge of two adjacent mandrel features. In this way, it is now possible to define a width (e.g., wider) of a metal line using a SADP integration scheme. In embodiments, the resist material 26 can be patterned using a conventional lithography process, e.g., exposure to energy (light).

Figure 3:
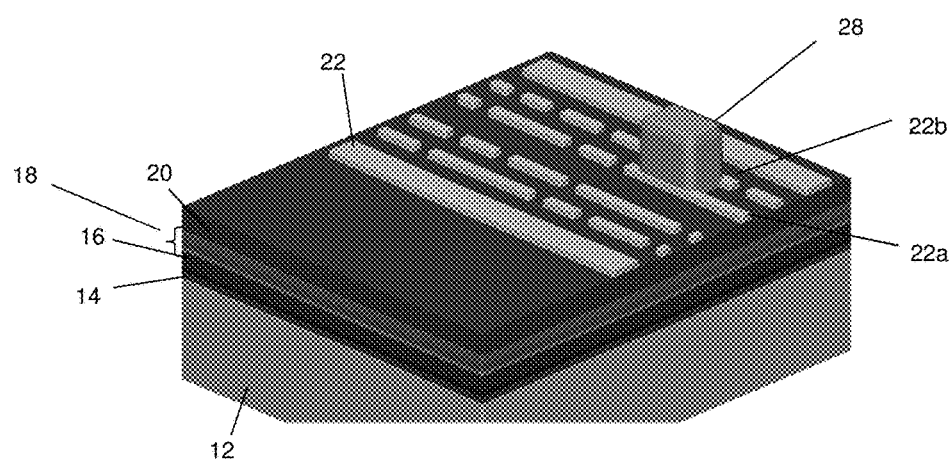
FIG. 3 shows a patterned lithography stack, amongst other features, and respective fabrication processes in accordance with aspects of the present disclosure.

In FIG. 3, the pattern of the resist material is transferred into the lithography stack to form a patterned lithography stack or block 28. More specifically, the pattern of the resist material is transferred into the lithography stack by conventional etching processes, e.g., RIE. The patterning will result in a patterned lithography stack or block 28 which bridges between two adjacent patterns 22a, 22b of the patterned hardmask 22 (and subsequent cut mandrels). It should be understood by those of skill in the art that the patterned lithography stack 28 will effectively extend over the amorphous material 20 that is between the two line patterns 22a, 22b. Any residual resist can be removed by a conventional stripping process such as oxygen ashing or other stripants.

Figure 4:
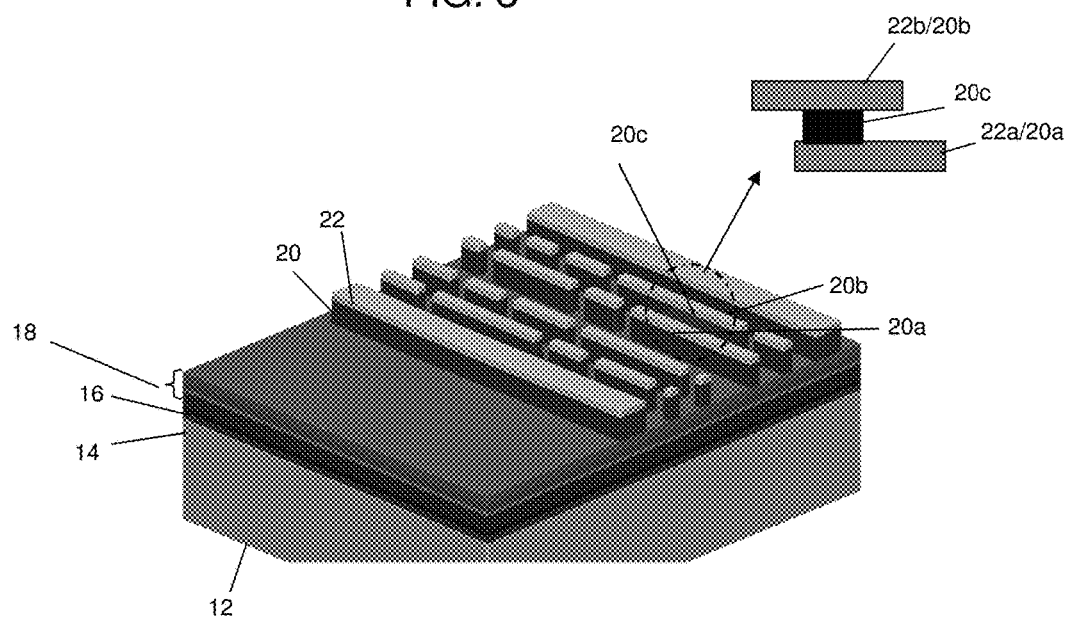
FIG. 4 shows merged mandrel features, amongst other features, and respective fabrication processes in accordance with aspects of the present disclosure.

As shown in FIG. 4, the pattern of the patterned lithography stack 28 and the patterned hardmask 22 is transferred to the underlying amorphous material 20. That is, during an etching process, the patterned lithography stack 28 and the patterned hardmask 22 will protect the underlying amorphous material 20, while remaining or unprotected amorphous material 20 is removed. In this way, the underlying amorphous material 20 will be formed into mandrel features or lines, which will coincide with the lines of the patterned hardmask 22; whereas, the underlying amorphous material 20 under the patterned lithography stack 28 will be formed into a bridge 20c that merges the adjacent patterned mandrel features 20a, 20b formed from the pattern of the patterned hardmask 22. In this way, the merged mandrel features will be at least as wide as adjacent mandrels and a space therebetween. The patterned lithography stack 28 can be removed by conventional etching process, e.g., RIE, with chemistries that are selective to the material of the lithography stack.

Figure 5:
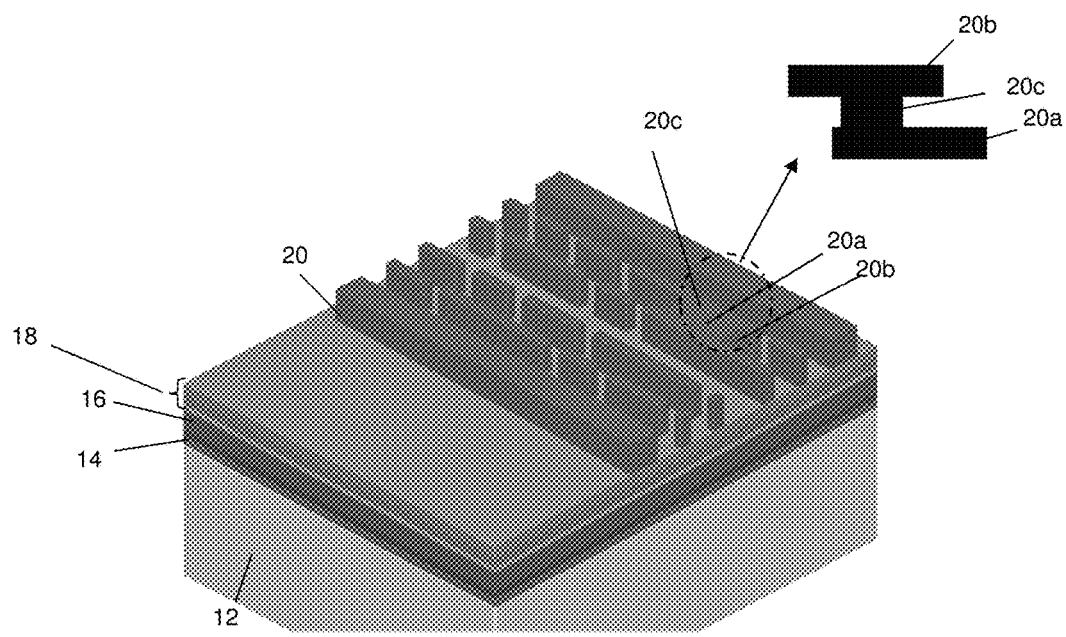
FIG. 5 shows merged mandrel features, amongst other features, and respective fabrication processes in accordance with aspects of the present disclosure.

In FIG. 5, the patterned hardmask 22 is removed using conventional etching processes that are selective to the material of the hardmask. In embodiments, the hardmask stack 18 will protect the underlying dielectric material 16 during the etching process, resulting in the mandrel features including, e.g., merged mandrel lines 20a, 20b, 20c of the amorphous material 20. As should be understood, this pattern of mandrel features can now be transferred to the underlying dielectric material 14 using conventional transfer processes, which will result in a wiring line that is wider than other wiring lines.

Figure 6:
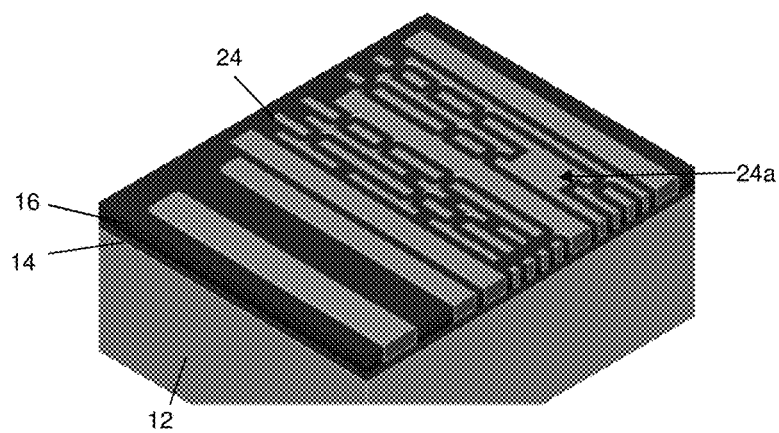
FIG. 6 shows wiring lines (including wide lines), amongst other features, and respective fabrication processes in accordance with aspects of the present disclosure.

FIG. 6 shows the formation of the wiring structures and respective fabrication processes. By way of example, in FIG. 6, the mandrel lines including, e.g., merged mandrel lines 20a, 20b, 20c of the amorphous material 20, are transferred into the underlying dielectric material 16 using known processes as is understood by those of ordinary skill in the art such that no further explanation is required herein for an understanding of such fabrication processes.

By way of brief explanation, though, the mandrel lines which include the merged mandrel lines 20a, 20b, 20c of the amorphous material 20 can be transferred into the underlying dielectric material 16 by sidewall image techniques (SIT). In the SIT technique, for example, after forming of the mandrel cuts (and the merged mandrel features), spacers are formed on the sidewalls of the mandrels, preferably of material that is different than the mandrels, and which are formed using conventional deposition and etching processes known to those of skill in the art. After several deposition, lithography and etching steps, which are also used to form wiring patterns (e.g., wiring structures) outside of the SADP pattern, the mandrels (including the merged mandrel lines 20a, 20b, 20c) are removed or stripped using a conventional etching process, selective to the mandrel material. An etching process is then performed within the spacing of the spacers to form trenches in the dielectric material 16, which correspond in size and shape to the mandrels (including the merged mandrel lines 20a, 20b, 20c). The sidewall spacers can then be stripped.

Following the above processes, the trenches in the dielectric material 16 are filled with a conductive material, e.g., copper, cobalt, tungsten, ruthenium, or poly-silicon, to form the wiring structures 24. A wide wiring structure 24a is also formed by filling the trenches that correspond to the merged mandrel features 20a, 20b, 20c. The trenches outside of the SADP pattern are also filled with conductive material to form metallization features (wiring structures). In embodiments, the conductive material can be deposited by a conventional deposition process, e.g., chemical vapor deposition (CVD), followed by a planarization process, e.g., chemical mechanical polishing (CMP).

In embodiments, the wide wiring structure 24a can be several wide wiring structures with any combination of, e.g., 1×, 5×, 9×, etc. of the ground rule. The wide wiring structure 24a can also be used as a power rail for conducting high electrical current. In addition, this method is compatible with current processes of record or can be implemented as an add-on process module at any places to define wide and narrow power rails (e.g., metal lines) at any location, with the flexibility of using a SADP integration scheme.

The method(s) as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The descriptions of the various embodiments of the present disclosure have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed:

1. A structure comprising:
   at least one metal line having a first dimension in a self-aligned double patterning (SADP) line array; and
   at least one metal line having a second dimension inserted into the SADP line array, the second dimension being different than the first dimension,
   wherein the at least one metal line with the second dimension comprises a first metal line and a second metal line which are merged together by a metal bridge connecting the first metal line to the second metal line, and
   wherein the at least one metal line with the first dimension is a single metal line wiring structure.

2. The structure of claim 1, wherein the second dimension is greater than the first dimension.

3. The structure of claim 2, wherein the second dimension includes at least a width of two metal lines having the first dimension and a space therebetween.

4. The structure of claim 1, wherein the second dimension of the metal line in the SADP line array is greater than 1× of a ground rule.

5. The structure of claim 1, wherein the first dimension and the second dimension correspond to different mandrel features.

6. The structure of claim 5, wherein the second dimension corresponds to a merged mandrel features in the SADP line array.

7. The structure of claim 1, wherein the SADP array includes additional metal lines that are of the first dimension.

8. The structure of claim 7, wherein, in the SADP array, the additional metal lines are on opposing side of the first metal line and the second metal line merged together by the metal bridge.

9. The structure of claim 8, wherein, in the SADP array, there are at least three metal lines with the first dimension.

10. The structure of claim 9, wherein, in the SADP array, further metal lines are alternating with the at least three metal lines with the first dimension.

11. The structure of claim 7, wherein the at least one metal line with the second dimension is a power rail which conducts electrical current.

12. The structure of claim 11, wherein the first metal line and the second metal line are parallel to one another within the SADP array.

13. The structure of claim 12, wherein the at least one metal line with the first dimension includes at least two metal wiring lines comprising a first metal wiring line within the SADP array and a second metal wiring line outside of the SADP array, both of which have a width of the first dimension.

* * * * *